United States Patent
Teranishi

(10) Patent No.: US 10,990,493 B2
(45) Date of Patent: Apr. 27, 2021

(54) SUBSTRATE-RELATED OPERATION MACHINE CONTROL DEVICE

(71) Applicant: FUJI CORPORATION, Chiryu (JP)

(72) Inventor: Yosuke Teranishi, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/620,641

(22) PCT Filed: Jun. 26, 2017

(86) PCT No.: PCT/JP2017/023408
§ 371 (c)(1),
(2) Date: Dec. 9, 2019

(87) PCT Pub. No.: WO2019/003276
PCT Pub. Date: Jan. 3, 2019

(65) Prior Publication Data
US 2020/0142797 A1    May 7, 2020

(51) Int. Cl.
*G06F 11/28* (2006.01)
*G06F 11/30* (2006.01)
*G06F 11/36* (2006.01)
*G06F 15/78* (2006.01)

(52) U.S. Cl.
CPC .............. *G06F 11/28* (2013.01); *G06F 11/30* (2013.01); *G06F 11/3636* (2013.01); *G06F 15/78* (2013.01)

(58) Field of Classification Search
CPC ...... G06F 11/28; G06F 11/30; G06F 11/3636; G06F 11/378

USPC .......................................................... 714/45
See application file for complete search history.

(56) References Cited

U.S. PATENT DOCUMENTS

2011/0055438 A1*  3/2011  Nakagawa .......... G06F 11/0766
                                                             710/33

FOREIGN PATENT DOCUMENTS

JP          2016-91277 A          5/2016

OTHER PUBLICATIONS

Leehevalier, D., et al., "Towards a Domain-Specific Framework for Predictive Analytics in Manufacturing", IEEE International Conference on Big Data, 2014, XP32717270, pp. 987-995.
International Search Report dated Sep. 19, 2017 in PCT/JP2017/023408 filed Jun. 26, 2017.

\* cited by examiner

*Primary Examiner* — Yair Leibovich
(74) *Attorney, Agent, or Firm* — Oblon, McClelland, Maier & Neustadt, L.L.P.

(57) ABSTRACT

A board work machine control device, which appropriately executes the real-time tracing while reducing the processing load, includes a processor configured to control a board work machine and a tracing data output device configured to output tracing data which is outputted from the processor to an exterior, and the tracing data output device includes a tracing register configured to temporarily store the tracing data which is outputted from the processor; a ring buffer where for the tracing data which is temporarily stored in the tracing register to be written, and an output control section configured to reduce the tracing data for the output on a real-time basis.

7 Claims, 5 Drawing Sheets

SUBSTRATE-RELATED OPERATION MACHINE CONTROL DEVICE

TECHNICAL FIELD

The present description relates to a board work machine control device.

BACKGROUND ART

A board work machine, mounting components such as electronic components on a board, is known. The board work machine includes a board conveyance device for conveying a board, a component supply device for supplying a component, and a component transfer device for transferring a component to a board. The board work machine performs multiple processes such as conveying a board, supplying a component, transferring a component, and the like to produce a circuit board or the like. In addition, the board work machine can deal with production of multiple types of boards which are different in types and sizes.

Incidentally, a system capable of executing real-time tracing is known (refer, for example, to Patent Literature 1). In this system, CPU writes tracing data to a predetermined storage domain via a memory controller. The CPU and the memory controller are incorporated in an IC chip. The predetermined storage area is incorporated in DRAM that can be attached to and detached from the IC chip. The tracing data written in the storage domain is read out by a read-out circuits in accordance with a detecting timing of a control signal from the memory controller to the DRAM, and is used for real-time tracing. Applying this real-time tracing to the board work machine is important for proper execution of board production by debugging and performing a defect analysis.

PATENT LITERATURE

Patent Literature 1: JP-A-2016-91277

BRIEF SUMMARY

Technical Problem

In the tracing system, in order to achieve the real-time tracing, it is necessary for the CPU to write tracing data on the storage domain and for the read-out circuit to read out and output the tracing data from the storage domain. However, outputting the tracing data is unnecessary at the time of normal operation of the device but is necessary only at the time of debugging or defect analysis, and outputting only a part of the tracing data for specific analysis or the like is good enough, and therefore, in the event that all of the tracing data stored in the storage domain is read out and outputted and such reading out and outputting are performed as a normal operation, it ends up a wasteful processing in normal operation on the device's side, which increases the processing load as a whole of the entire device.

It is an object of the present description to provide a board work machine control device which can appropriately execute real-time tracing while reducing the processing load.

Solution to Problem

The present description discloses a board work machine control device including: a processor configured to control a board work machine; and a tracing data output device configured to output tracing data, being outputted from the processor, to an exterior, the board work machine control device further comprising, the tracing data output device includes a tracing register configured to temporarily store the tracing data which is outputted from the processor; a ring buffer into which the tracing data temporarily stored in the tracing register is written, and an output control section configured to reduce the tracing data stored in the ring buffer and output it on a real-time basis.

According to the present disclosure, the tracing data that the processor generates and outputs is temporarily stored in the tracing register of the tracing data output device, and thereafter, the tracing data is written into the ring buffer so as to reduce the tracing data for the output on the real-time bases. Therefore, according to the board work machine control device, all the tracing data which is stored on the ring buffer of the tracing data output device from the processor is not normally outputted to the exterior, and hence, it becomes possible to avoid the occurrence of a wasteful outputting process of unnecessary tracing data. As a result, it is possible to reduce the processing load for outputting the tracing data, thereby making it possible to appropriately execute the real-time tracing while reducing the processing load.

DESCRIPTION OF EMBODIMENT

1. Configuration of Board Work Machine Control Device

Figure 1:
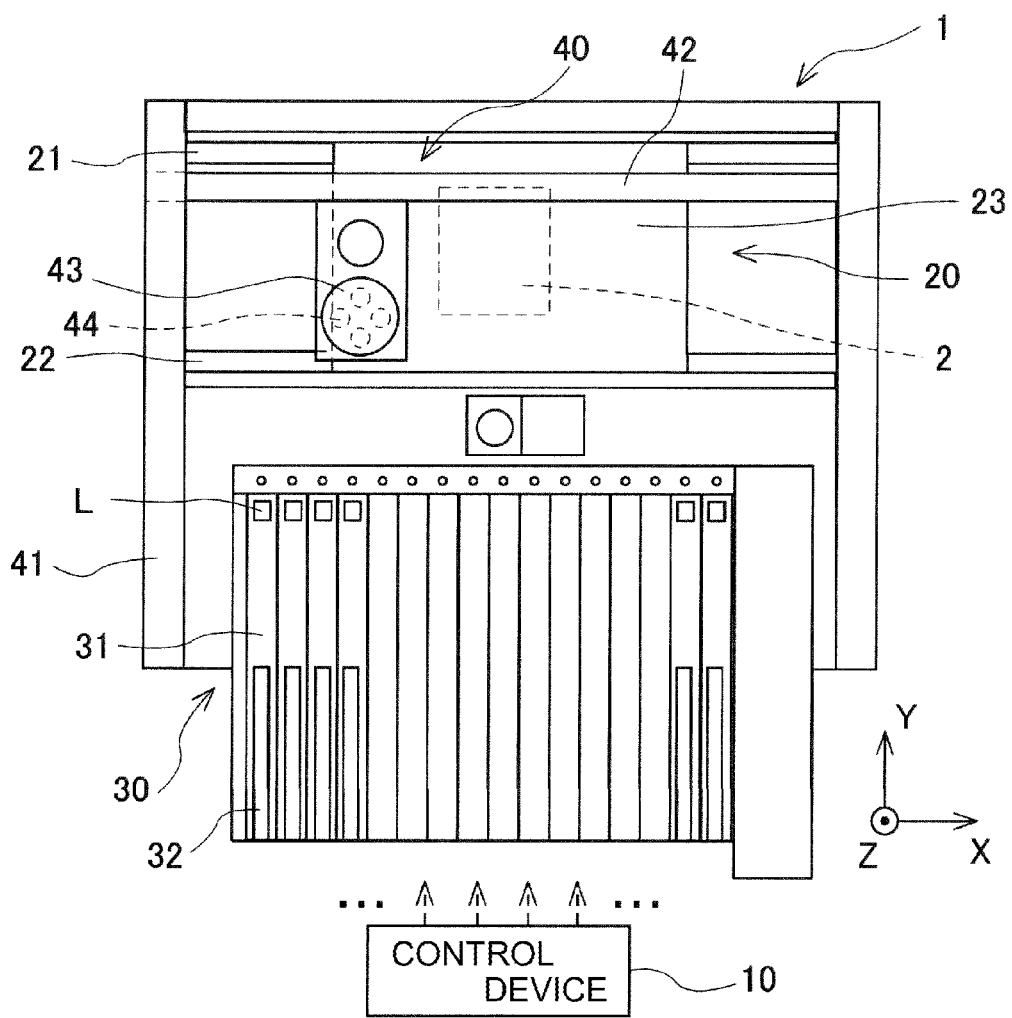
FIG. 1 is a block diagram of a board work machine on which a board work machine control device according to an embodiment is mounted.

Referring to FIGS. 1 to 5, the configuration of a board work machine control device 10 according to the present embodiment will be described. The board work machine control device 10 of the present embodiment is a control device mounted on a board work machine 1 for mounting components on a board such as a circuit board. As illustrated in FIG. 1, the board work machine 1 includes board conveyance device 20, component supply device 30, and component transfer device 40 as a component mounter. The board work machine 1 may be such as to include various types of processing devices (for example, a supply device for supplying a flux that is transferred to a component, a recovery device for recovering a discarded component, and a cleaning device for cleaning a nozzle of a mounting head) that are mounted in place of, for example, a component feeder of component supply device 30.

Board conveyance device 20 is a device for conveying board 2. Board conveyance device 20 includes a pair of guide rails 21, 22 and board holding section 23. Board conveyance device 20 is rested on board holding section 23 and conveys board 2 that is guided in conveyance direction X by pair of guide rails 21, 22 that are disposed parallel to each other with a space defined therebetween in conveyance direction X as a result of a revolving operation of a conveyor belt. When board 2 is conveyed to a predetermined component mounting position by board conveyance device 20, board 2 is positioned by a clamping device. Guide rails 21, 22 and board holding section 23 of board conveyance device 20 and the clamping device may be able to be replaced as required in accordance with types, sizes, shapes, and the like of board 2.

Component supply device 30 is a device for supplying a component that is mounted on board 2 to a predetermined supply position L. Component supply device 30 includes part feeder 31. Part feeder 31 is held in a slot provided on a main body side of board work machine 1 detachably and exchangeably. Part feeder 31 holds reel 32 around which a carrier tape installing thereon multiple components is wound detachably and rotatably. Reel 32 is provided for a component type. Part feeder 31 moves carrier tape that is wound around reel 32 through revolution of an electric motor so that components installed on the carrier tape are caused to travel towards the predetermined supply position L.

Component transfer device 40 is a device for transferring the component supplied to the predetermined supply position L towards board 2 that is positioned in a predetermined mounting position. Component transfer device 40 includes Y-axis slider 41, X-axis slider 42, and mounting head 43.

Y-axis slider 41 is a device that can move by using a Y-axis servomotor along a guide rail that extends in a direction normal to conveyance direction X of board 2 (hereinafter, referred to as normal direction Y). X-axis slider 42 is attached to Y-axis slider 41 in such a manner as to move towards conveyance direction X. X-axis slider 42 is a device that is moved together with Y-axis slider 41 in normal direction Y as Y-axis slider 41 moves in normal direction Y to change its position and that is moved in conveyance direction X of board 2 by an X-axis servomotor to change its position.

Mounting head 43 is attached to X-axis slider 42. Mounting head 43 moves in conveyance direction X as X-axis slider 42 moves in conveyance direction X and moves in normal direction Y as Y-axis slider 41 moves in normal direction Y. A rotary head is provided rotatably on mounting head 43. A spindle is provided on the rotary head in such a manner as to move upwards and downwards. A suction nozzle or gripping chuck (hereinafter, referred to as nozzle or the like 44) is detachably attached to a distal end of the spindle. Nozzle or the like 44 is a member for holding a component that has arrived at the redetermined supply position L through suction or gripping. Mounting head 43 can hold multiple nozzles or the like 44. Mounting head 43 and nozzle or the like 44 can be changed as required in accordance with types, sizes, and shapes of target components.

Nozzle or the like 44 can move relative to the rotary head of mounting head 43 in an up-down direction that is at right angles or normal to both conveyance direction X and normal direction Y. Nozzle or the like 44 picks up and gripping the component of component supply device 30 that has arrived at predetermined supply position L using a vacuum or the like and rests the component so picked up or gripped on to board 2 that is positioned in the predetermined component mounting positioned by board conveyance device 20 by releasing the component that is so picked up or gripped on.

Figure 2:
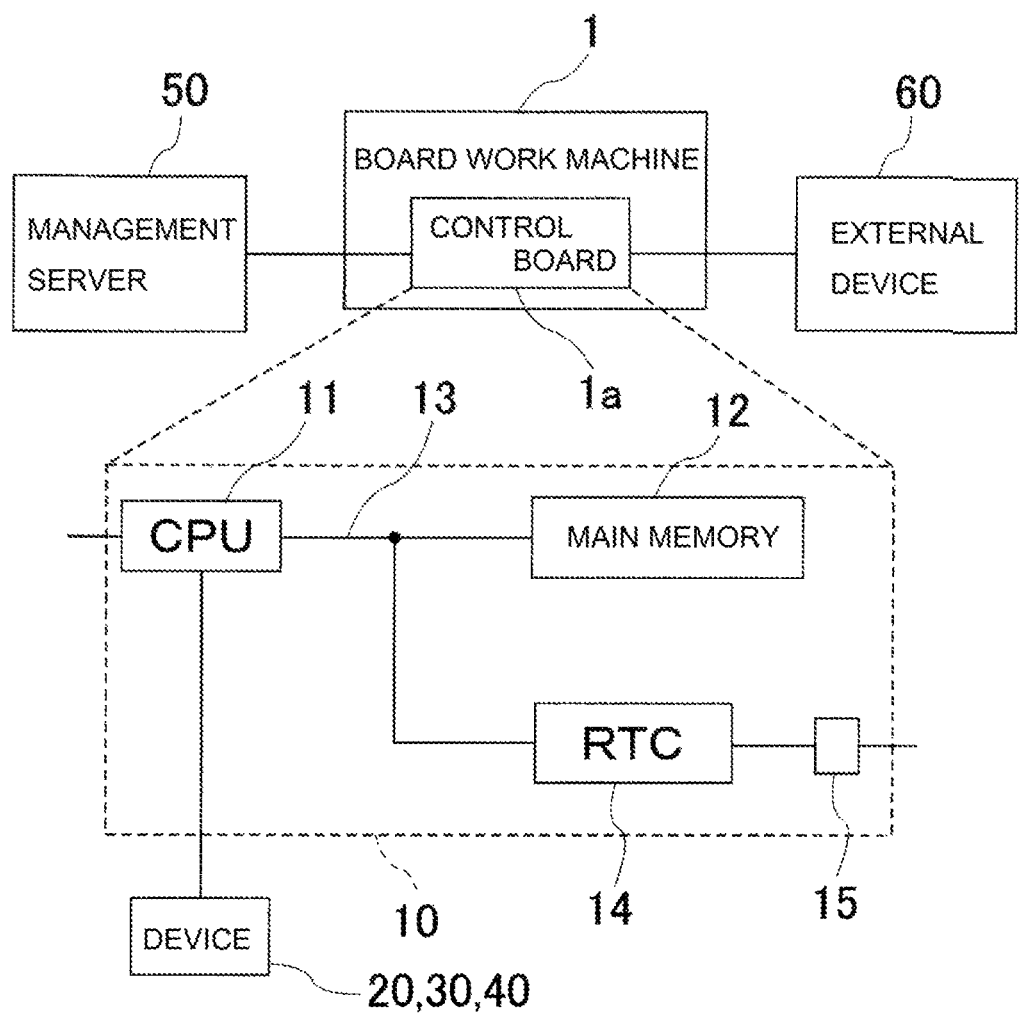
FIG. 2 is a block diagram of a system including the board work machine of the present embodiment and is a block diagram of the board work machine control device.

Board work machine 1 includes board work machine control device 10 described above (hereinafter, referred simply to as control device 10). Control device 10 is attached to the main body side of board work machine 1 and is provided on control board 1a that is mounted on boar work machine 1. Control device 10 is mainly made up of a computer and can execute a control process by being provided with electric power from a power supply. As shown in FIG. 2, control device 10 includes CPU (Central Processing Unit) 11 and main memory 12.

CPU 11 is connected to and communicates with management server 50 provided in a factory where board work machine 1 is installed. CPU 11 is also connected to respective working members (for example, part feeder 31 to be used among multiple part feeders 31, nozzle or the like 44 to be used among multiple nozzles or the like 44 mounted on mounting head 43) of devices 20, 30, 40. In the case where devices 20, 30, 40 include control devices for controlling their own working members, CPU 11 only needs to be connected to and communicate with those control devices instead of CPU 11 being connected directly to the working members.

CPU 11 downloads a production job from management server 50 and produces boards 2 according to the production job. Specifically speaking, CPU 11 selects working members of devices 20, 30, 40 to be used from the multiple working members in accordance with a relationship among a production job stored in advance, the devices to be used and components to be used, specifies the mounting positions where the working members are mounted and issues a command to start operations to the working members.

The process to be performed by CPU 11 is executed based on a control program. In producing one board 2, in accordance with the control program, CPU 11 causes board conveyance device 20 to convey board 2 mounted on board holding section 23 in board conveyance direction X, causes component supply device 30 to supply a component to be mounted on board 2 to predetermined supply position L, and causes component transfer device 40 to pick up and grip the component so as to mount it on board 2. For example, in controlling the position of mounting head 43 and the picking up and gripping operation of nozzle or the like 44, CPU 11 calculates a control amount of nozzle or the like 44 based on signals or image signals outputted from various types of sensors provided on mounting head 43 and the like and issues a control command to nozzle or the like 44 in accordance with the control program. As a result, the position and the suction pickup operation of nozzle or the like 44 is controlled.

Figure 3:
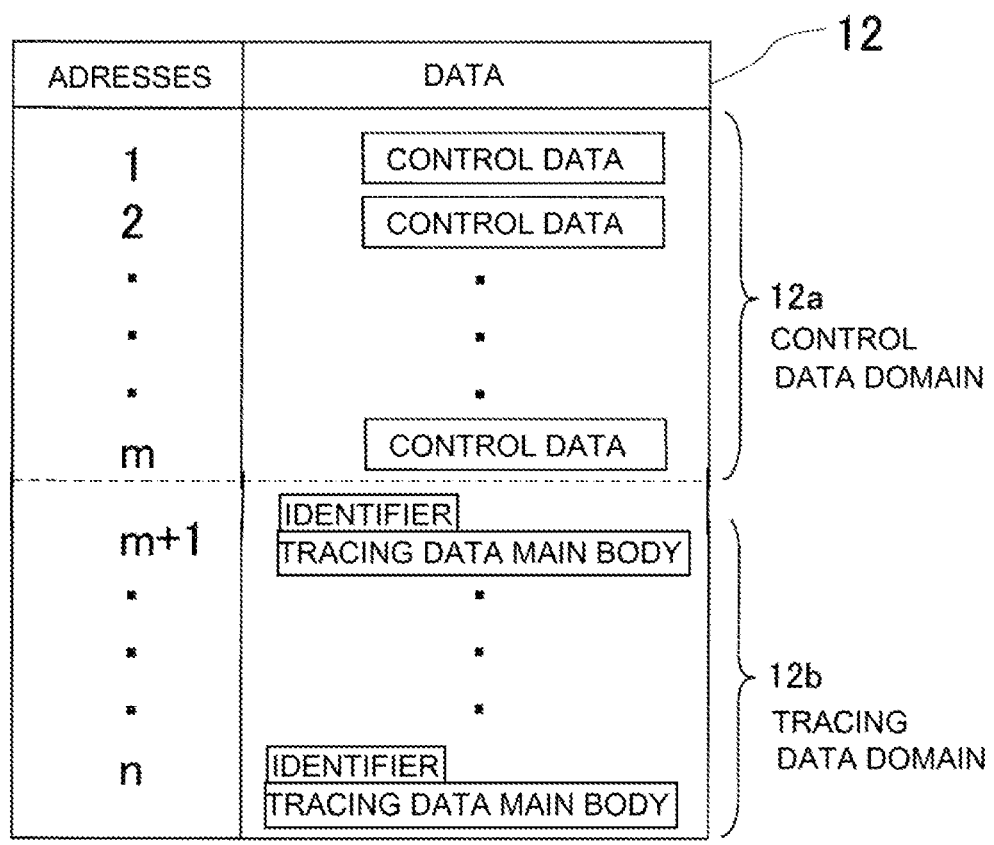
FIG. 3 is an internal block diagram of a main memory of the present embodiment and is a block diagram of data for each data domain.

CPU 11 is connected to main memory 12 via buss 13 made up of an address bus and a data bus. As shown in FIG. 3, main memory 12 includes control data domain 12a. Control data domain 12a is a memory domain where control data for use in a control program executed by CPU 11 is written and is read out. Control data domain 12a can store multiple pieces m of control data.

CPU 11 transmits control data to be used in the control program described above directly to main memory 12 via bus 13 and writes the control data on control data domain 12a of main memory 12. The control data is written on control data domain 12a for storage therein. CPU 11 reads out the control data stored in control data domain 12a as required for use in the control program.

CPU 11 also generates tracing data necessary for tracing at the time of debugging or analyzing a defect. Tracing data that CPU 11 generates includes a tracing data main body and identifier information. The tracing data main body includes commands, data values, data addresses, values of a register such as a program counter, and the like in steps that are executed in CPU 11. The identifier information is type data indicating a type of a tracing data main body in the tracing data, and includes identification information on working members (for example, mounting head 43, part feeder 31, and the like) that are used in board work, being performed by board work machine 1, or information on the type of software that CPU 11 has executed (for example, application software that is used in system software that is used in an OS layer or application software that is used in an application layer). The identifier information ought to be stored in a header section of the tracing data.

As shown in FIG. 3, main memory 12 includes a tracing data domain 12b apart from the control data domain 12a described above. The tracing data domain 12b is a memory domain where to write tracing data that is generated by an execution by CPU 11. The tracing data domain 12b can store multiple pieces (n-m) of tracing data and is made into a ring buffer-like configuration. Tracing data that CPU 11 generates is written to be stored in the tracing data domain 12b of main memory 12 using a procedure, which will be described later.

Figure 4:
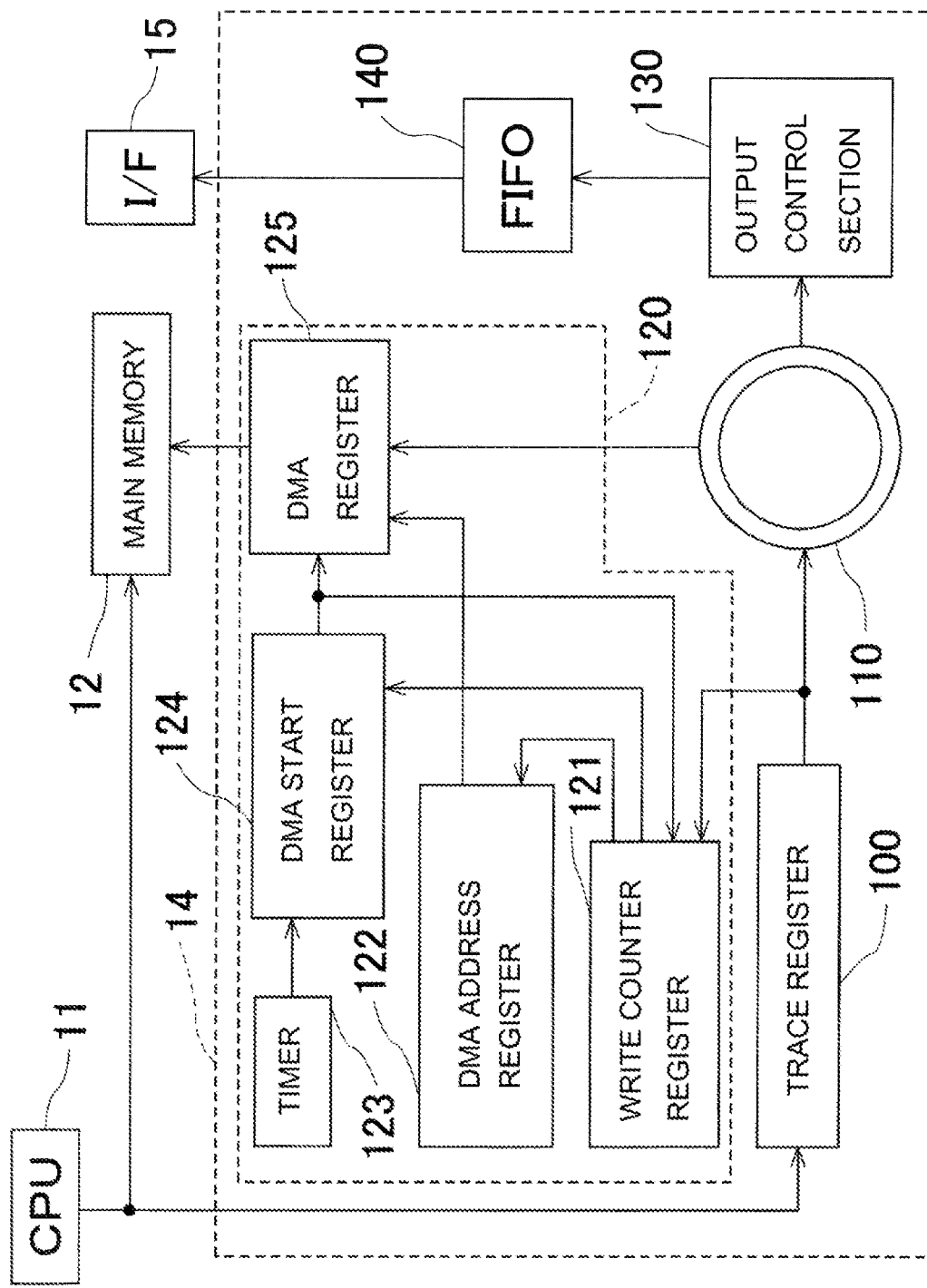
FIG. 4 is a block diagram of the board work machine control device of the present embodiment.
Figure 5:
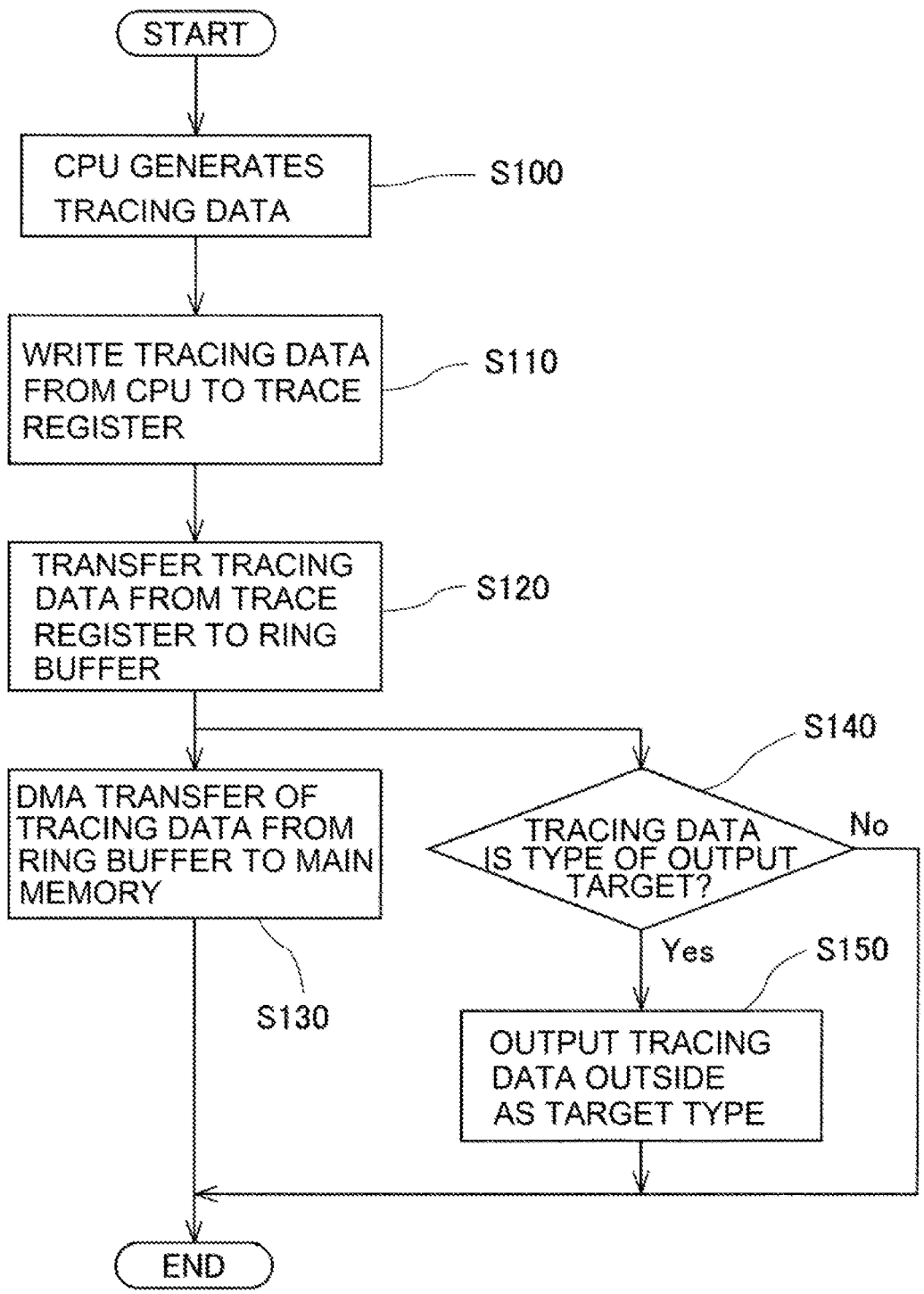
FIG. 5 is a flowchart of an example of a process that is executed in the board work machine control device of the present embodiment.

Control device 10 also includes real-time tracing chip (hereinafter, referred to as RTC) 14. RTC 14 is a tracing data output device configured to control the output of tracing data generated by CPU 11 and outputted from CPU 11 to an exterior. RTC 14 is connected to CPU 11 via bus 13 and is connected to CPU 11 in parallel to main memory 12. As shown in FIG. 4, RTC 14 includes trace register 100, ring buffer 110, direct memory access (DMA) controller 120, output control section 130, and first-in-first-out (FIFO) 140.

CPU 11 writes the generated tracing data described above on trace register 100 of RTC 14 via bus 13. Trace register 100 can temporarily store tracing data for one frame. Trace register 100 is connected to ring buffer 110. The tracing data that is temporarily stored in trace register 100 is transferred to ring buffer 110 to be written therein. Ring buffer 110 has a ring buffer-like configuration. Ring buffer 110 is divided into a predetermined number of domains and can store multiple pieces of tracing data at the same time.

Ring buffer 110 is connected to DMA controller 120. DMA controller 120 is a portion for performing a DMA transfer to write the tracing data stored in ring buffer 110 on tracing data domain 12b in main memory 12 via bus 13 periodically. DMA controller 120 includes write counter register 121, DMA address register 122, timer 123, DMA start register 124, and DMA register 125.

Write counter register 121 is a register for counting the number of times tracing data is written from trace register 100 to ring buffer 110. A count value of write counter register 121 is incremented by one count each time the tracing data is written from trace register 100 to ring buffer 110. DMA address register 122 is a register for indicating an address for a DMA transfer of tracing data by DMA register 125, which will be described later. DMA address register 122 updates an address range of trace data that needs to be transmitted in the next DMA transfer based on a count value of write counter register 121, and indicates the address range to DMA register 125.

Timer 123 counts a time that has elapsed since a point in time when DMA register 125 has performed the last DMA transfer of tracing data. The count time of timer 123 and the count value of write counter register 121 are both outputted to DMA start register 124. DMA start register 124 is a register for instructing DMA register 125 to start a DMA transfer of tracing data from ring buffer 110 based on the count time of timer 123 and the count value of write counter register 121.

The DMA transfer instruction by DMA start register 124 is performed at a predetermined cycle that is determined in advance or when ring buffer 110 becomes full within the predetermined cycle. That is, DMA start register 124 instructs DMA register 125 to start DMA transfer when the count time of timer 123, which is the time from the last DMA transfer, reaches the predetermined cycle, or when the count value of write counter register 121 reaches a predetermined number at which ring buffer 110 becomes full although the count time of timer 123 does not reach the predetermined cycle.

The instruction to start the DMA transfer by DMA start register 124 is supplied to write counter register 121. The count value of write counter register 121 is reset when a DMA transfer instruction by DMA start register 124 is supplied thereto. Thereafter, the count value of write counter register 121 is incremented by one count from zero every time tracing data is written onto ring buffer 110.

DMA register 125 DMA-transfers the tracing data stored in ring buffer 110 to main memory 12 to write the tracing data in tracing data domain 12b of main memory 12. A DMA transfer by DMA register 125 is performed in accordance with a DMA transfer start instruction from DMA start register 124. Then, the DMA transfer is to read out tracing data within an address range indicated by DMA address register 122 from ring buffer 110 and write the tracing data so read out in tracing data domain 12b of main memory 12.

Ring buffer 110 is also connected to output control section 130. Output control section 130 is a section to control an external output of the tracing data that is transferred from trace register 100 to ring buffer 110 to be written therein. Output control section 130 can reduce the tracing data that has been written in ring buffer 110, and output it. The reduced output of the tracing data by output control section 130 is to output only a target type of tracing data that is set in advance at the time of output in all the tracing data that is written in ring buffer 110. Output control section 130 may be such that output control section 130 can cause all the tracing data written in ring buffer 110 not to be outputted or can cause all the tracing data written in ring buffer 110 to be outputted.

The target type of tracing data that is outputted by output control section 130 can manually be selected as required by an operator who handles the tracing data. For example, when the operator desires a real-time tracing of mounting head 43, the target type of tracing data is set at tracing data for mounting head 43. Alternatively, when the operator desires a real-time tracing of the application software, the target type of tracing data is set at tracing data for the application software.

When the tracing data is transferred from trace register 100 to ring buffer 110 to be written therein, the output control section 130 determines whether the written tracing data is tracing data of the target type that is set in advance at that point in time. This determination is performed based on the identifier information included in the tracing data. When determining that the tracing data written in ring buffer 110 is not of the target type, output control unit 130 does not output the tracing data. On the other hand, when determining that the tracing data written in ring buffer 110 is of the target type, output control section 130 outputs the tracing data.

Output control section 130 is connected to FIFO 140. The tracing data that output control section 130 outputs is inputted into FIFO 140. FIFO 140 can store the tracing data in a queue. FIFO 140 outputs the tracing data inputted from output control section 130 to an exterior in the order in which the tracing data is inputted thereinto. When multiple pieces of tracing data are stored at the same time, the tracing data is outputted in the first-in first-out order in terms of timings at which the multiple pieces of tracing data are inputted into FIFO 140. The tracing data outputted from FIFO 140 is input to external device 60 via external output interface 15.

External device 60 is a display device that is visible from the operator, a large-capacity external storage device that can store tracing data, or the like. External device 60 is connected so as to communicate with external output interface 15 of control device 10 wirelessly or by a wire. As shown in FIG. 2, External device 60 may be disposed outside board work machine 1 or may be disposed inside board work machine 1.

2. Processing of Tracing Data

Next, the processing of tracing data in control device 10 will be described. In control device 10, CPU 11 generates tracing data required for tracing (step S100 in FIG. 5). Then, CPU 11 transmits the tracing data so generated to bus 13 so that the tracing data is written in trace register 100 of RTC 14 (step S110). The tracing data transmitted from CPU 11 to bus 13 is written in trace register 100 of RTC 14. When the tracing data is written in trace register 100, the tracing data is transferred to ring buffer 110 to be written therein (step S120). When the tracing data is written from trace register 100 in ring buffer 110, the count value of write counter register 121 of DMA controller 120 is incremented by "1".

Writing tracing data in trace register 100 by CPU 11, transferring the tracing data from trace register 100 to ring buffer 110, and incrementing the count value by write counter register 121 are repeatedly performed every time tracing data is generated by CPU 11.

DMA address register 122 updates an address range of trace data that needs to be transmitted in the next DMA transfer based on a count value of write counter register 121, and indicates the address range to DMA register 125. DMA start register 124 instructs DMA register 125 to start a DMA transfer of tracing data from ring buffer 110 based on the count time of timer 123 and the count value of write counter register 121. This instruction to start the DMA transfer is executed, for example, when the time since the last DMA transfer reaches the predetermined cycle, or when the count value of write counter register 121 reaches the predetermined number at which ring buffer 110 becomes full even through the time does not reach the predetermined cycle.

When instructed to start a DMA transfer of tracing data by DMA start register 124, DMA register 125 reads out tracing data within the address range indicated by DMA address register 122 from ring buffer 110 and transfers the tracing data so read out to tracing data domain 12b of main memory 12 to write the tracing data therein using a DMA function (S130 steps).

In this way, in control device 10, in writing the trace data generated by CPU 11 in main memory 12, CPU 11 only needs to perform the process of writing the tracing data in trace register 100 of RTC 14. When CPU 11 writes the tracing data trace register 100 of RTC 14, the tracing data is DMA-transferred from trace register 100 via ring buffer 110 to main memory 12 by DMA register 125 of DMA controller 120 to be written in main memory 12.

Writing the tracing data in main memory 12 is not performed directly from CPU 11 to main memory 12 but is performed indirectly to main memory 12 via ring buffer 110 after CPU 11 firstly writes the tracing data in trace register 100 of RTC 14. In the case where CPU 11 writes the tracing data in trace register 100, compared with a case where CPU 11 writes the tracing data in main memory 12, CPU 11 writes the tracing data at high speeds. Therefore, according to control device 10, while causing tracing data generated by CPU 11 to be stored appropriately stored in main memory 12, the time required to write the tracing data by CPU 11 to realize the storage can be reduced.

In control device 10, when the tracing data is written from trace register 100 of RTC 14 to ring buffer 110, output control section 130 determines whether the tracing data is tracing data of an output target type based on identifier information included in the tracing data (step S140). Then, when determining that the tracing data is the tracing data of the output target type, the output control section 130 outputs the tracing data to FIFO 140. FIFO 140 outputs the tracing data inputted from output control section 130 to external device 60 via external output interfaces 15 in the order in which the tracing data is inputted (step S150).

In this way, in control device 10, tracing data generated by CPU 11 is written in trace register 100 of RTC 14, whereby the tracing data can be outputted to external device 60 via ring buffer 110 and FIFO 140 on the real-time basis. Therefore, according to control device 10, in outputting the tracing data to the external device 60 on the real time basis, since CPU 11 only needs to perform the process of writing the tracing data in trace register 100 of RTC 14, real-time outputting of tracing data can be achieved without increasing the processing load of CPU 11.

In this way, according to control device 10, as a result of CPU 11 performing the process of writing the tracing data in trace register 100 of RTC 14, the tracing data is automatically transferred from trace register 100 to ring buffer 110, thereafter writing the tracing data in min memory 12 (specifically, in tracing data domain 12b) and outputting the tracing data on the real time basis can both be realized. As a result, writing the tracing data in main memory 12 and outputting the tracing data on the real time basis can be prevented from being started by different triggers, whereby the processing load can be reduced or the process can be simplified.

Further, control device 10 reduces the tracing data generated by CPU 11 and outputs the reduced tracing data to external device 60. That is, the tracing data outputted from control device 10 to external device 60 is the tracing data of the target type that is set in advance in all the tracing data written from CPU 11 to trace register 100 of RTC 14. Therefore, by appropriately setting the target type of tracing data to be outputted, tracing data of an unnecessary type can be excluded from all tracing data generated by CPU 11, and only tracing data of a necessary type can be outputted to external device 60.

For example, when the operator desires a real-time tracing of part feeder 31, tracing data for part feeder 31 is set as tracing data of the output target type, whereby only the tracing data of part feeder 31 in all the tracing data generated by CPU 11 is outputted from control device 10 to external device 60 on the real time basis. When the operator desires a real-time tracing of system software (an OS layer), tracing data for the system software is set as tracing data of the output target type, whereby only the tracing data of the system software in all the tracing data generated by CPU 11 is outputted from control device 10 to external device 60 on the real time basis.

Therefore, according to control device 10, not all the tracing data stored in RTC 14 from CPU 11 is normally outputted to external device 60, and hence, a wasteful output of tracing data of an unnecessary types can be avoided. As a result, the processing load in outputting tracing data can be reduced, whereby the real-time tracing can be executed properly while reducing the processing load, and hence, the efficiency of debugging or defect analysis can be improved.

As is obvious from the above description, control device 10 of the present embodiment includes CPU 11 for controlling board work machine 1 and RTC 14 for outputting tracing data output from CPU 11 to the external device. RTC 14 includes trace register 100 configured to temporarily store the tracing data outputted from CPU 11, ring buffer 110 configured to write the tracing data that is temporarily stored in trace register 100 therein, and output control section 130 configured to reduce the tracing data stored in ring buffer 110 and output it on the real time basis.

According to this configuration, when the tracing data generated and outputted by CPU 11 is temporarily stored in trace register 100 of RTC 14 and is then written in ring buffer 110 so as to reduce the tracing data for the output on the real-time bases. Therefore, according to control device 10, since not all the tracing data stored in ring buffer 110 of RTC 14 from CPU 11 is normally outputted to the outside (specifically, external device 60), it is possible to avoid the occurrence of a wasteful output process of unnecessary tracing data. As a result, it is possible to reduce the processing load for outputting the tracing data, thereby making it possible to appropriately execute the real-time tracing while reducing the processing load.

In control device 10, control device 10 further includes main memory 12. Main memory 12 includes control data domain 12a in which control data to be used by CPU 11 is written by CPU 11, and tracing data domain 12b in which all the tracing data written in ring buffer 110 is periodically transferred and written by the DMA function.

According to this configuration, the domain where the control data is written and the domain where the tracing data is written are separated in the main memory. Therefore, it is possible to prevent the control data to be used by CPU 11 and the tracing data generated by CPU 11 from mixing up within the main memory. In addition, CPU 11 only needs to perform the process of writing the tracing data in trace register 100 of RTC 14, whereby writing the tracing data in tracing data domain 12b of main memory 12 as well as outputting the tracing data on the real time basis can be achieved after the tracing data is transferred from trace register 100 to ring buffer 110. Therefore, not only can the processing load be reduced, but also the process can be simplified. Further, since CPU 11 writes the data in trace register 100, compared with a case where CPU 11 writes the data in main memory 12, CPU 11 can write the data at high speeds. Therefore, while causing the tracing data generated by CPU 11 to be stored as in main memory 12 required, the time required for CPU 11 to write the tracing data to realize the storage can be reduced.

In control device 10, the tracing data includes the tracing data main body and the identifier information indicating the type of the tracing data main body. Output control section 130 reduces and outputs the tracing data stored in ring buffer 110 in accordance with the type data of the tracing data so written. In addition, output control section 130 outputs tracing data of the type selected in advance in the tracing data written in ring buffer 110.

According to this configuration, the external output of tracing data by output control section 130 is performed by reducing the tracing data in accordance with the type of tracing data. Therefore, the tracing data to be outputted on the real time basis can be limited to a specific type of data.

Specifically, board work machine 1 includes the multiple working members such as the devices 20, 30, 40 for use in board work. The type data of the tracing data is set in accordance with each of the multiple working members. Then, in the tracing data that is written in ring buffer 110, output control section 130 outputs tracing data of the working member that is set in advance among the multiple working members. The type data of the tracing data is set in accordance with the type of software including the system software and the application software. Then, output control section 130 outputs tracing data for predetermined software in the tracing data that is written in ring buffer 110.

Further, control device 10 is provided on a control board 1a mounted in board work machine 1. According to this configuration, control device 10 provided on board work machine 1 can execute the real time tracing output and the storage of tracing data in main memory 12.

It should be noted that the present disclosure is not limited to the embodiment described above but can be modified variously without departing the spirit and scope of the present disclosure.

REFERENCE SIGNS LIST

1: Board work machine, 2: Board, 10: Board work machine control device, 11: CPU (processor), 12: Main memory, 13: Bus, 14: RTC (Real-time trace chip), 20: Board conveyance device, 30: Component supply device, 40: Component transfer device, 50: Management server, 60: External device, 100: Trace register, 110: Ring buffer, 120: DMA controller, 130: output control section, 140: FIFO.

The invention claimed is:

1. A board work machine control device comprising a processor configured to control a board work machine, and a tracing data output device configured to output tracing data, being outputted from the processor, to an exterior,
   wherein, the tracing data output device further comprises:
   a tracing register configured to temporarily store the tracing data which is outputted from the processor;
   a ring buffer into which the tracing data temporarily stored in the tracing register is written; and
   an output control section configured to reduce the tracing data stored in the ring buffer to output the reduced tracing data on a real-time basis.

2. The board work machine control device according to claim 1, wherein the board work machine control device includes a main memory, and the main memory comprises:
   a control data domain into which control data for use by the processor is written by the processor; and
   a tracing data domain into which all the tracing data, having been written into the ring buffer, is periodically transferred by a direct memory access function.

3. The board work machine control device according to claim 1,
   wherein the tracing data comprises a tracing data main body and type data indicating a type of the tracing data main body, and
   wherein the output control section reduces the tracing data in accordance with the type data of the tracing data stored in the ring buffer and outputs the reduced tracing data.

4. The board work machine control device according to claim 3,
   wherein the output control section outputs the tracing data of a type selected in advance in the tracing data written in the ring buffer.

5. The board work machine control device according to claim 4,
   wherein the board work machine comprises multiple working members that are used in board work, wherein the type data is set correspondingly to each of the multiple working members, and wherein the output control section outputs the tracing data for a working member predetermined among the multiple working members, the outputted tracing data being from the tracing data stored in the ring buffer.

6. The board work machine control device according to claim 4, wherein the type data is set in accordance with a type of software including system software and application software, and wherein the output control section outputs the tracing data for software that is set in advance in the tracing data that is stored in the ring buffer.

7. The board work machine control device according to claim 1, wherein the board work machine control device is provided on a control board that is installed on the board work machine.

* * * * *